United States Patent
Chiang

(10) Patent No.: US 7,339,196 B2
(45) Date of Patent: Mar. 4, 2008

(54) PACKAGING OF SMD LIGHT EMITTING DIODES

(75) Inventor: Chia-Wen Chiang, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 255 days.

(21) Appl. No.: 11/166,655

(22) Filed: Jun. 25, 2005

(65) Prior Publication Data

US 2006/0289888 A1    Dec. 28, 2006

(51) Int. Cl.
*H01L 27/15*    (2006.01)
*H01L 29/22*    (2006.01)

(52) U.S. Cl. .......................................... 257/81; 257/99
(58) Field of Classification Search ............ 257/79–85, 257/88, 91, 93, 94–99, E33.056, E33.057, 257/E33.058, E33.075
See application file for complete search history.

(56) References Cited

U.S. PATENT DOCUMENTS

| | | | |
|---|---|---|---|
| 5,857,767 A | 1/1999 | Hochstein | 362/294 |
| 6,376,902 B1 | 4/2002 | Arndt | 257/678 |
| 6,469,321 B2 | 10/2002 | Arndt | 257/82 |
| 6,501,103 B1 | 12/2002 | Jory et al. | 257/100 |
| 6,531,328 B1 | 3/2003 | Chen | 438/26 |
| 6,561,680 B1 | 5/2003 | Shih | 362/294 |
| 6,573,580 B2 | 6/2003 | Arndt | 257/433 |
| 6,598,998 B2 | 7/2003 | West et al. | 362/307 |
| 6,666,567 B1 | 12/2003 | Feldman et al. | 362/237 |
| 6,679,621 B2 | 1/2004 | West et al. | 362/327 |
| 6,693,356 B2 | 2/2004 | Jiang et al. | 257/767 |
| 6,740,903 B2 | 5/2004 | Isoda | 257/81 |
| 6,759,733 B2 | 7/2004 | Arndt | 257/672 |
| 2006/0006404 A1* | 1/2006 | Ibbetson et al. | 257/99 |

* cited by examiner

*Primary Examiner*—Hung Vu

(57) ABSTRACT

An SMD LED package with superior thermal dissipation capability is provided. The SMD LED package comprises a supporting block with circuit patterns and at least one LED attached to the supporting block. Wherein, circuit patterns of holes/vias, insulating layers, and conducting traces/pads are formed on and in the supporting block. The SMD LED packages can be further assembled to form a light module that allows emitted lights to travel in parallel with the mounting surface. The SMD manufacturing process is a mature production process and thus easy for mass production. Single or plural LED chips are mounted on a thermal conducting block that is disposed with patterns of conducting traces/pads and isolating dielectric layers. The side emitting characteristics of the present invention offers the advantage of reflecting and mixing the emitted lights to meet the desired chromaticity.

12 Claims, 9 Drawing Sheets

PACKAGING OF SMD LIGHT EMITTING DIODES

FIELD OF THE INVENTION

The present invention generally relates to the packaging of light emitting diodes (LEDs), and more specifically to the packaging of a surface mount device (SMD) LED that provides superior heat dissipation capability and side-emitting characteristics.

BACKGROUND OF THE INVENTION

LEDs have been proposed for use as light sources for many years. Recent developments of LED technology have expanded the use of LEDs from signs and message boards to automobile interior and exterior lights and traffic lights. However, the light output of LED light sources is very sensitive to temperature, and in fact is permanently degraded by excessive temperature. The aforementioned applications require that the substrate for the LEDs has a high heat dissipation capability, good heat-resistant property, and high mechanical strength. An LED light source with high heat dissipation capability to quickly carry away excessive heat is essential for maintaining its high performance.

A light source for illuminating an information source is often required in many applications, such as liquid crystal displays (LCDs). In general, a backlight module is required for the LCDs to illuminate the information to be displayed. LEDs are moving into the LCD backlight module market as well. The advantages of LED light sources include long life, ease of replacement, robust mechanical property, relatively high efficacy, and better color quality than fluorescent lamps.

Certain applications (e.g., avionics) require a specific chromaticity of light emitted from the LCD backlight module. However, most commercially available LEDs are made with a limited number of chromaticity choices and their chromaticity may change over time. An LED light source with a raised LED, as shown in FIG. 1, to improve the chromaticity of a combined light was disclosed in U.S. Pat. No. 6,666,567. The raised structure permits lights to be emitted from the base of the LED. Additionally, reflective protrusions may be placed beneath the raised LED to aid in redirecting the light trajectory. A combination of fluorescent lamps and LEDs were also proposed to form a hybrid light source. However, all these schemes increase the complexity and cost of the light source.

An LCD backlight which includes a first LED array that provides light with a first chromaticity and a second LED array that provides light with a second chromaticity, was disclosed in another U.S. Pat. No. 6,608,614. The lights emitted from these two LED arrays are combined through a combining element (e.g., a wave guide) and then projected towards an LCD stack. The LED chip normally emits lights in a direction that is approximately perpendicular to the chip surface. The directions of the lights emitted from the first and the second LED arrays are approximately perpendicular and parallel to the panel surface, respectively. A separate combining element is required in this light source. The chromaticity of the combined light can only be adjusted by changing the chromaticity of the second LED array through a control system. Therefore, there is a limited flexibility for chromaticity adjustment.

According to another prior art, a Luxeon side-emitter having packaged LED chips was disclosed, as shown in FIG. 2. The side-emitter may provide good uniformity of combined lights but the light intensity is poor. In addition, these packaged LED chips normally occupy a large area. It is known that the majority of lights emitted from LED chips travel in a direction approximately perpendicular to the chip surface. Therefore, the LED chips need to be arranged in a way such that the lights emitted from different LED chips have a chance to be combined and mixed in order to achieve desired chromaticity before they reach a display screen.

Surface mountable LEDs can achieve the side-emitting characteristics by attaching the LED chips in a way that allows the emitted lights to radiate approximately parallel to the mounting surface. Then, the lights can be further combined to obtain a desired chromaticity and redirected to the display screen. The packaging of SMD LEDs consists of circuit type and lead-frame type. The lead-frame type uses metallic lead frames as substrates and injection or compression molding, followed by cutting the structure into SMD LED packages as shown in FIG. 3. The circuit type uses composite circuit board as substrate, followed by compression molding and cutting the structure into SMD LED packages as shown in FIG. 4. The above two SMD LED packages can be found in U.S. Pat. Nos. 6,573,580 and 6,740,903. Another SMD LED package using silicon wafer as the substrate is proposed in U.S. Pat. No. 6,531,328 in 2003. This manufacturing process is not mature and the fragile silicon wafer may aggravate the poor manufacturing yield.

SUMMARY OF THE INVENTION

The present invention has been made to overcome the drawbacks of conventional LED light sources. The primary objective of the present invention is to provide an SMD LED package with superior thermal dissipation capability and side emitting characteristics using a low-cost mature manufacturing process for easy mass production.

The SMD LED package comprises a supporting block with circuit patterns and at least an LED attached to the supporting block. Wherein, circuit patterns of holes/vias, insulating layers, and conducting traces/pads are formed on and in the supporting block. The materials of the supporting block can be made of high thermal conductivity materials. Therefore, the heat dissipation capability of the LED packages is greatly enhanced.

According to the present invention, the manufacturing process of the SMD LED package comprises the following steps: 1) starting with a supporting substrate that can be chosen from the group of metal, ceramic, organic/plastic, and composite material depending on desired applications, 2) forming arrays of LED circuit patterns of holes/vias, insulating layers, and conducting traces/pads on the supporting block, 3) attaching at least one LED chip on each patterned circuit block and then electrically connected to the circuit pads (e.g., through wire bonding or flip chip technology), 4) separating the LED array structure into an SMD LED package.

Insulation is required in the aforementioned manufacturing process for a metal supporting substrate. While, insulation is not necessary in the manufacturing process for a ceramic supporting substrate.

The SMD LED packages of the present invention can be further mounted on another substrate or lead frame to form an LED light module that allows the lights to be emitted in parallel to the mounting surface. This side emitting characteristics offers an advantage of reflecting and mixing the emitted lights to meet the desired chromaticity. Furthermore, the SMD manufacturing process in the present invention is a mature production process and easy for mass production.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 5B:
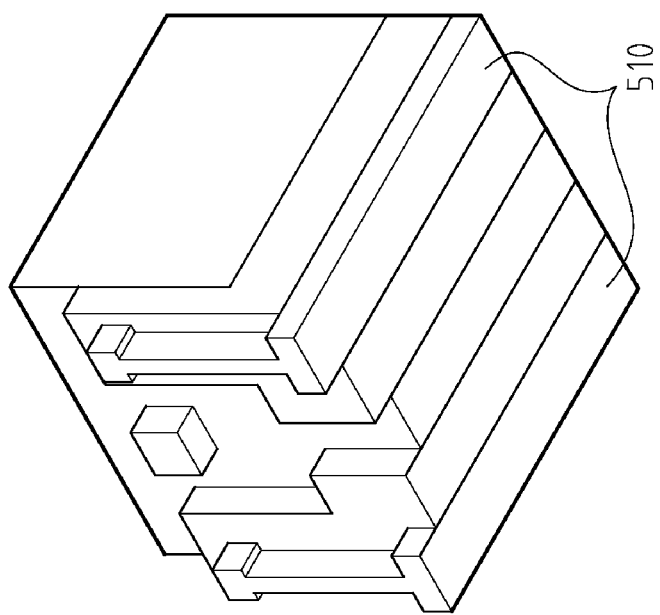
FIG. 5b is a perspective view of the SMD LED package shown in FIG. 5a after a 90-degree rotation.
Figure 5A:
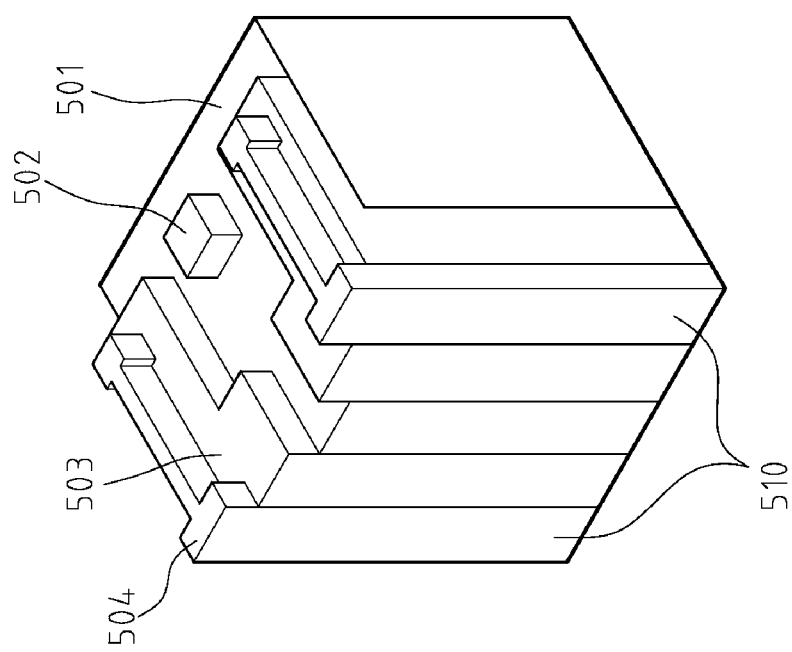
FIG. 5a shows a perspective view of an SMD LED package according to a preferred embodiment of the present invention.

FIG. 5a shows a perspective view of an SMD LED package according to a preferred embodiment of the present invention. In the embodiment, the SMD LED package 500 comprises a supporting block 501 with circuit patterns and at least an LED chip 502 attached to the supporting block 501. The circuit patterns, which comprise an insulating layer 503 and conducting layer 504 for LED connection and SMD connection, are formed on and in the supporting block 501. The electrical connection of the LED chip 502 to the supporting block 501 can be obtained through metal bumps or bonding wires or some kinds of flip chip technology. And, the pattern design of the insulating layer 503 and the conducting layer 504 will be changed accordingly. These circuit patterns can be formed using conventional printed circuit board (PCB) or packaging process, such as printing, plating, sputtering, laser processing, etc.

Without loss of generality, only an LED chip is shown in FIG. 5a. FIG. 5b is a perspective view of the SMD LED package shown in FIG. 5a after a 90-degree rotation. As shown in FIG. 5a, the conducting layer 504 extends along the side surface of the supporting block 501 to form a surface mounting conducting layer 510. The surface mounting conducting layer 510 is perpendicular to the surface on which the LED chip is mounted. The SMD LED chip can be surface-mounted to a circuit board using the surface mounting conducting layer 510. The 90-degree rotation to make the surface mounting conducting layer 510 facing the circuit board is usually performed to allow the emitted lights to radiate approximately parallel to the mounting surface.

The supporting block 501 can be made of high thermal conductivity materials to enhance the heat dissipation capability of the LED package 500. In the preferred embodiment of the present invention, the supporting block may be made of electrically conducting material (such as metals) or insulating material (such as ceramics, plastics, and organic material).

Figure 1:
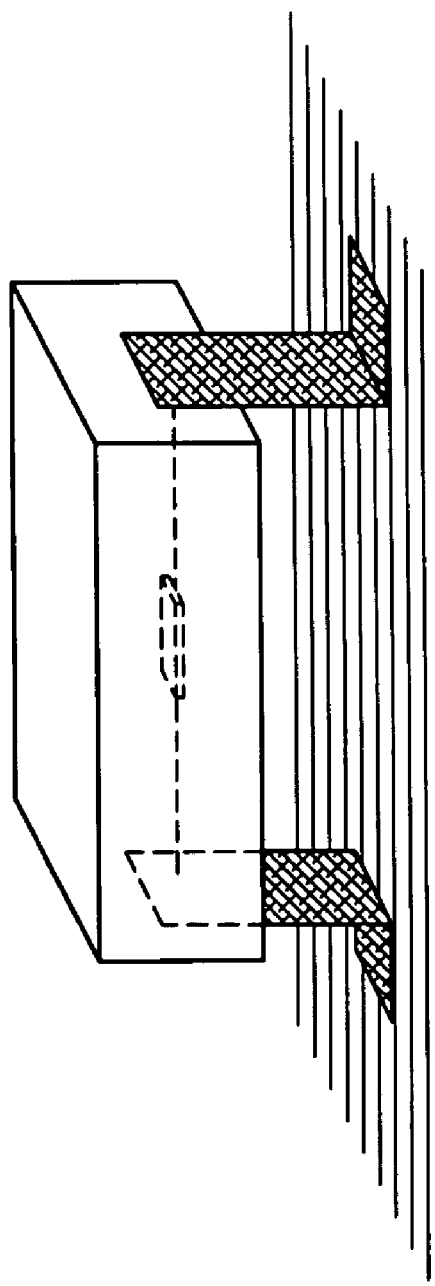
FIG. 1 shows a conventional raised LED structure.
Figure 2:
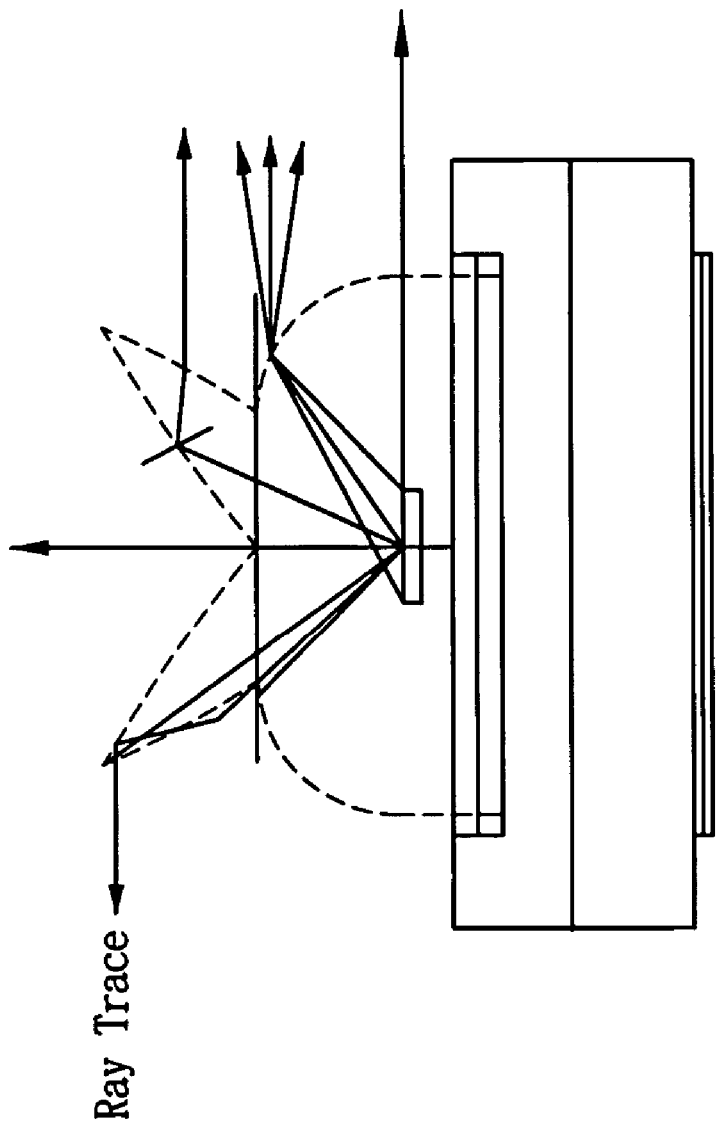
FIG. 2 shows a Luxeon side-emitter.
Figure 3:
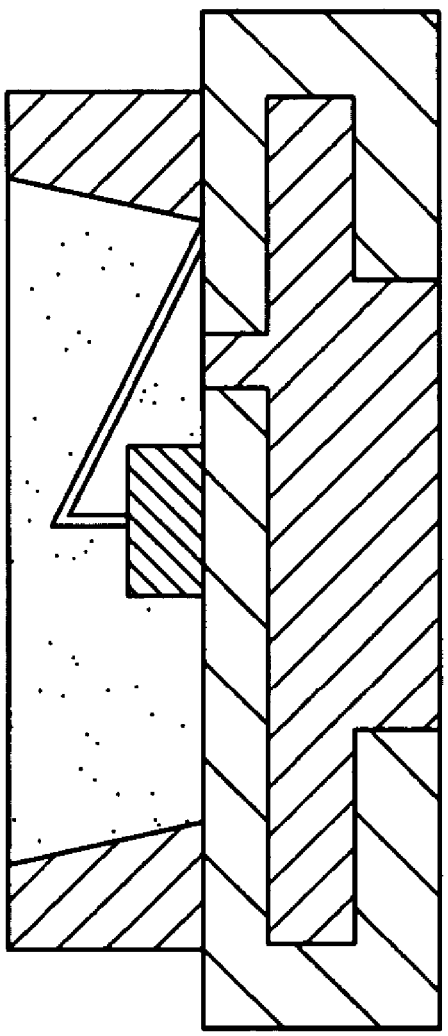
FIG. 3 shows the packaging structure of a lead-frame type SMD LED.
Figure 4:
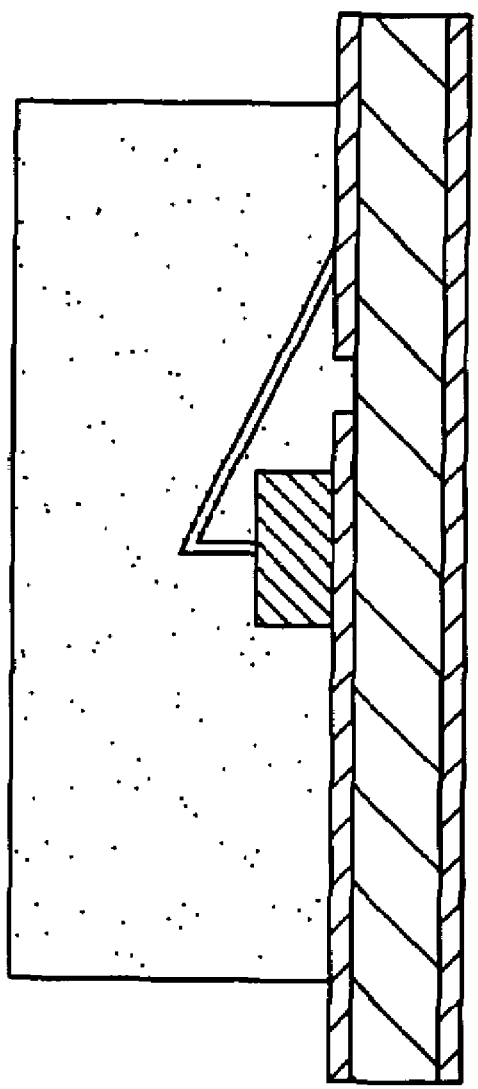
FIG. 4 shows the packaging structure of a circuit type SMD LED.
Figure 6C:
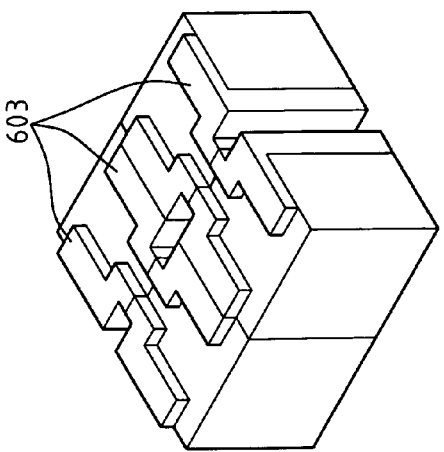
FIGS. 6a-6e show the manufacturing process of an SMD LED package with a metal-core supporting block according to the present invention.
Figure 6B:
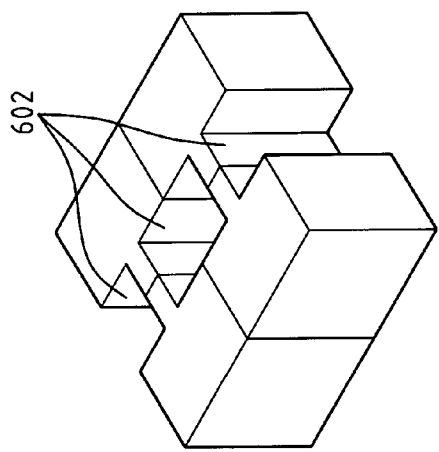
Figure 6A:
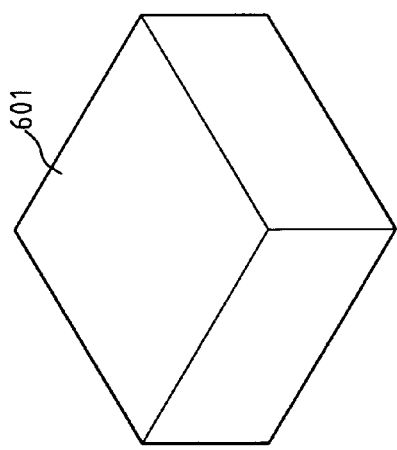
Figure 6E:
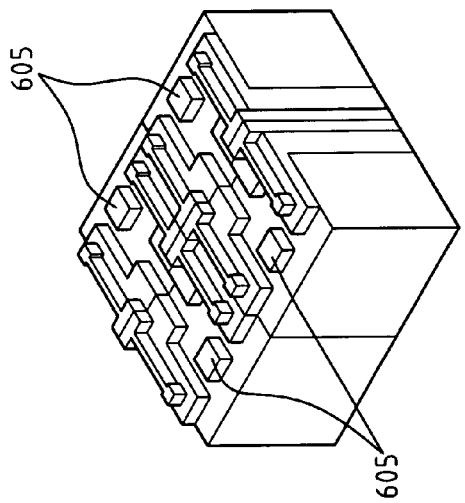
Figure 6D:
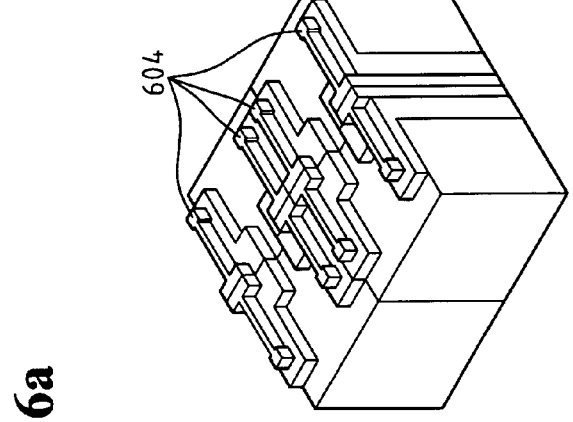
Figure 7C:
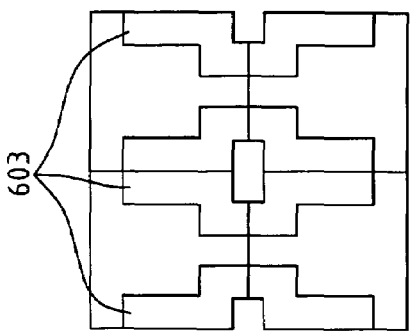
FIGS. 7a-7e are the top views of the processing steps in FIGS. 6a-6e.
Figure 7E:
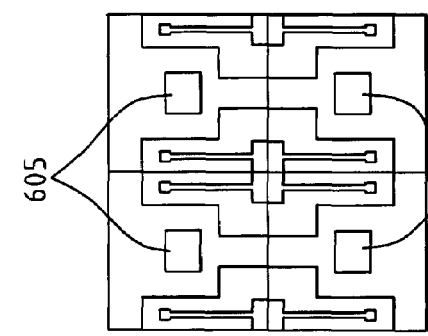
Figure 7B:
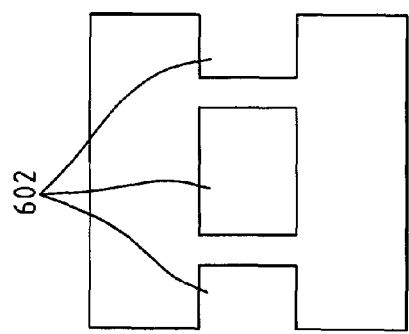
Figure 7D:
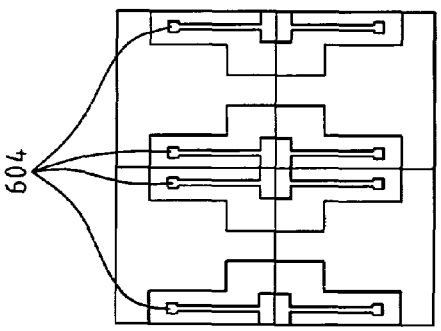
Figure 7A:
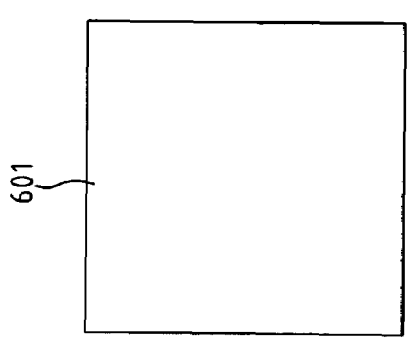

FIGS. 6a-6e show the manufacturing process of an SMD LED package with a metal-core supporting block according to the present invention. The manufacturing process comprises the steps of: 1) starting with a metal core substrate 601 as a supporting substrate, as shown in FIG. 6a, 2) opening vias/holes 602 in the substrate 601, as shown in FIG. 6b, 3) depositing and patterning an insulating layer 603 on the substrate 601, as shown in FIG. 6c, 4) depositing and patterning a conducting layer 604 on the insulating layer 603 and the substrate 601 to form conducting traces/pads on the insulating layer 603 and the substrate 601 for LED connection and for SMD process, as shown in FIG. 6d, 5) attaching one or more LED chip 605 on each patterned circuit block and electrically connecting the LED chip 605 to the connection pads (e.g., through wire bonding or flip chip technology), as shown in FIG. 6e. Finally, the manufacturing process is finished by molding (if necessary) and separating the LED array structure into SMD LED packages. FIGS. 7a-7e are the top views of the processing steps in FIGS. 6a-6e.

In the aforementioned manufacturing process, the insulating layer 603 may be resin, dielectric material, and so on. The conducting layer 604, which is used to form conducting traces/pads for LED connection or SMD process, can be deposited by plating or printing or sputtering or other deposition techniques. This conducting layer may be made of metal, such as Au, Cu, and so on. As shown in FIGS. 6c and 6d, the conducting layer 604 also fills the holes/vias 602 after the insulating layer 603 is formed. With the SMD LED package being separated into multiple individual SMD LEDs, the conducting layer in the holes/vias is cut through to form the surface mounting conducting layer 510 shown in FIGS. 5a and 5b. The surface mounting conducting layer 510 on the side face of the separated SMD LED package can be used thereafter as the soldering face during surface mount assembly process. A 90-degree rotation of the separated SMD LED package during board level assembly will allow the LED to emit lights approximately parallel to the mounting surface.

Figure 8B:
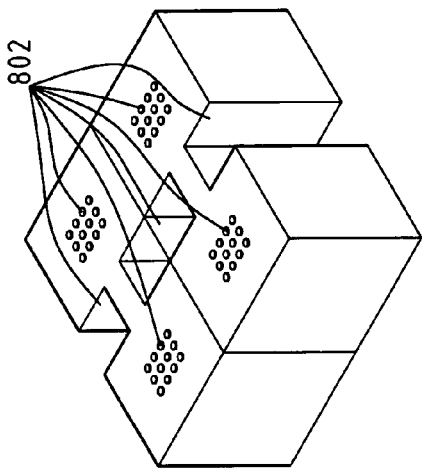
FIGS. 8a-8d show the manufacturing process of an SMD LED package with a ceramic supporting block according to the present invention.
Figure 8D:
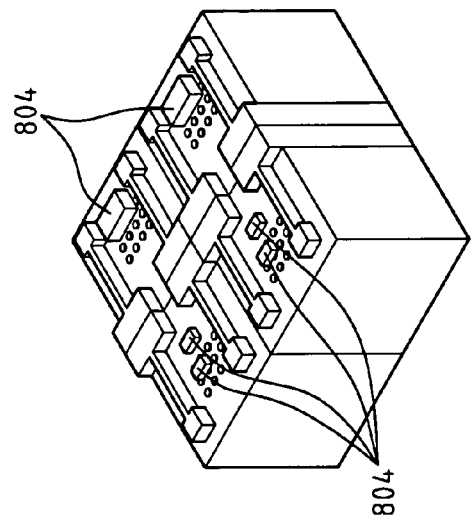
Figure 8A:
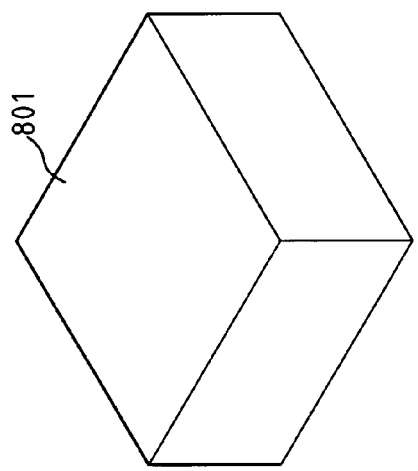
Figure 8C:
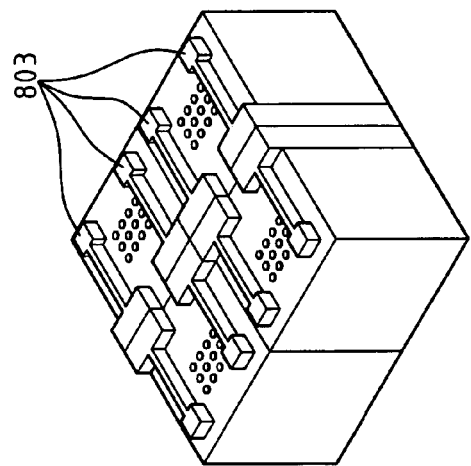

FIGS. 8a-8d show the manufacturing process of an SMD LED package with a ceramic supporting block according to the present invention. The manufacturing process comprises the steps of: 1) starting with a ceramic core substrate 801 as a supporting substrate, as shown in FIG. 8a, 2) opening vias/holes 802 in the substrate 801, as shown in FIG. 8b, 3) depositing and patterning a conducting layer 803 on the substrate 801 to form conducting traces/pads on the substrate 801 for LED connection and for SMD connection, as shown in FIG. 8c, 4) attaching one or more LED chip 804 on each patterned circuit block and then electrically connected to the connection pads (e.g., through wire bonding or flip chip technology), as shown in FIG. 8d. Finally, the manufacturing process is finished by molding (if necessary) and separating the LED array structure into SMD LED packages.

In the aforementioned manufacturing process, some thermal vias may be formed at step 2 shown in FIG. 8b in order to enhance heat dissipation of the LED package. The conducting layer 803, which is used to form conducting traces/pads for LED connection or SMD process, can be deposited by plating or printing or sputtering or other deposition techniques. This conducting layer may be made of metal, such as Au, Cu, and so on. The side face of the separated SMD LED package can be used thereafter as the soldering face during surface mount assembly process. A 90-degree rotation of the separated SMD LED package during board level assembly will allow the LED to emit lights approximately parallel to the mounting surface.

Figure 9:
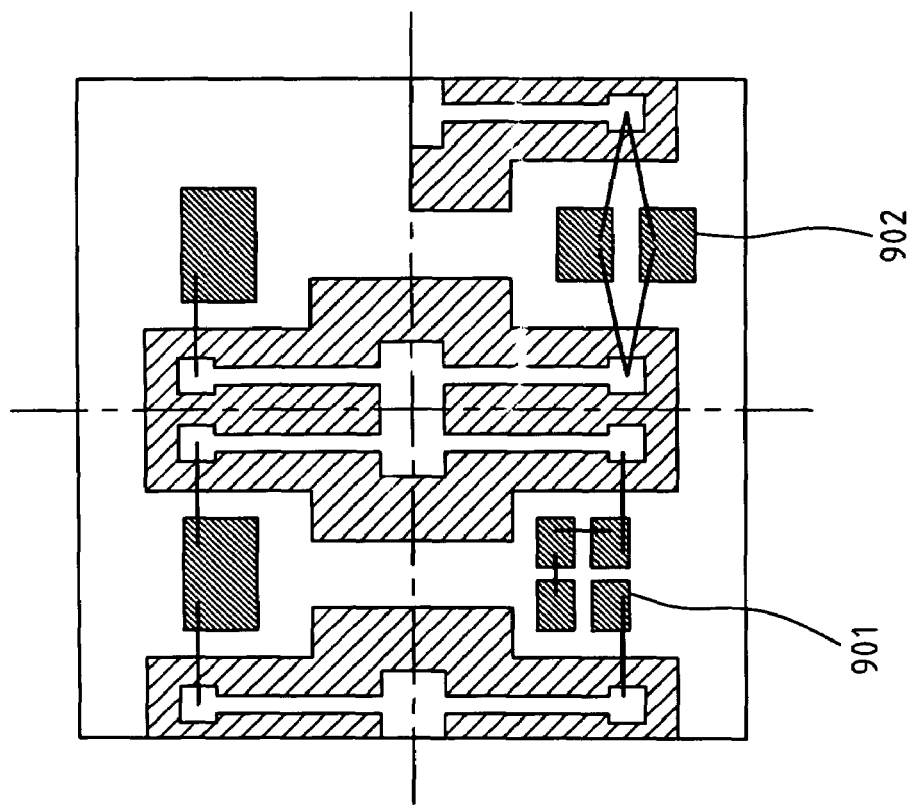
FIG. 9 shows a design example of LED package array and multiple-chip package.

FIG. 9 shows a design example of LED package array and multiple-chip package according to the present invention. In the design, it emphasizes on array design, sawing on opening, sawing on the edge, side emitting, and double side emitting. The dashed lines show the saw streets, which are to be cut during separation of the LED packages. The lower-left quadrant shows multiple LED chips 901 connected in series, and the lower-right quadrant shows multiple LED chips 902 connected in parallel.

As mentioned before, one of the characteristics of the present invention is to resolve the heat dissipation problem of the LED package. The enhancement of the heat dissipation capability of the LED packages can be easily achieved by selecting the materials of the supporting block from high thermal conductivity materials. According to the present invention, these SMD LED packages can be further mounted on another substrate or lead frame to form an LED light module that allows the lights to be emitted in parallel to the mounting surface. This side emitting characteristics offers an advantage of reflecting and mixing the emitted lights to meet the desired chromaticity. If desired, a control circuitry can be formed on the mounting substrate to power up the LEDs, to control the brightness of the LEDs, to provide electrostatic discharge protection for the LEDs, and to adjust the chromaticity of the combined light to meet desired applications. The SMD manufacturing process used in the present invention is a mature production process and thus easy for mass production.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A surface-mount-device (SMD) light emitting diode (LED) package, comprising:
   a supporting block with one or more holes thereon;
   a patterned insulating layer formed on said holes and said supporting block;
   a patterned conducting layer forming conducting traces/pads on said insulating layer and said supporting block for LED connection and filling said holes to form a surface mounting conductor for SMD connection; and
   one or more LED chips attached onto a surface of said supporting block and electrically connected to said conducting traces/pads;
   wherein separated SMD LEDs are cut from said SMD LED package with said surface mounting conductor being cut through to form surface mounting layers for said separated SMD LEDs, said surface mounting layers being perpendicular to the surface onto which said one or more LED chips are attached.

2. The SMD LED package as claimed in claim 1, wherein said supporting block comprises a high thermal conducting material.

3. The SMD LED package as claimed in claim 1, wherein the main body of said supporting block comprises an electrically conducting material.

4. The SMD LED package as claimed in claim 1, wherein said supporting block comprises a material chosen from the group of metals and composite materials.

5. The SMD LED package as claimed in claim 1, wherein each of said one or more LED chips is a bare LED chip encapsulated with a transparent material.

6. The SMD LED package as claimed in claim 1, wherein a control circuitry is formed on the surface of said supporting block to power up said one or more LED chips, to control the brightness of said one or more LED chips, to provide electrostatic discharge protection for said one or more LED chips, and to adjust the chromaticity of the emitted light of said one or more LED chips to meet desired applications.

7. A surface-mount-device (SMD) light emitting diode (LED) package comprising:
   a supporting block with holes;
   a patterned conducting layer forming conducting traces/pads on said supporting block for LED connection and filling said holes to form a surface mounting conductor for SMD connection; and
   one or more LED chips attached onto a surface of said supporting block and electrically connected to said conducting traces/pads;
   wherein separated SMD LEDs are cut from said SMD LED package with said surface mounting conductor being cut through to form surface mounting layers for said separated SMD LEDs, said surface mounting layers being perpendicular to the surface onto which said LED chips are attached.

8. The SMD LED package as claimed in claim 7, wherein said supporting block comprises a high thermal conductivity material.

9. The SMD LED package as claimed in claim 7, wherein said supporting block comprises an insulating material.

10. The SMD LED package as claimed in claim 7, wherein said supporting block comprises a material chosen from the group of ceramics, plastics, and composite materials.

11. The SMD LED package as claimed in claim 7, wherein each of said one or more LED chips is a bare LED chip encapsulated with a transparent material.

12. The SMD LED package as claimed in claim 7, wherein a control circuitry is formed on the surface of said supporting block to power up said one or more LED chips, to control the brightness of said one or more LED chips, to provide electrostatic discharge protection for said one or more LED chips, and to adjust the chromaticity of the emitted light of said one or more LED chips to meet desired applications.

* * * * *